(12) United States Patent
Malinowski et al.

(10) Patent No.: US 9,055,792 B2
(45) Date of Patent: Jun. 16, 2015

(54) SAPPHIRE COATED GEMSTONE

(75) Inventors: Jack Malinowski, Austin, TX (US); Gary Lacourt, Franklin, WI (US); Frank Calcagni, Austin, TX (US)

(73) Assignee: Lautrec Corporation, Franklin, WI (US)

( * ) Notice: Subject to any disclaimer, the term of this patent is extended or adjusted under 35 U.S.C. 154(b) by 382 days.

(21) Appl. No.: 13/577,068

(22) PCT Filed: Feb. 4, 2011

(86) PCT No.: PCT/US2011/023771
§ 371 (c)(1),
(2), (4) Date: Mar. 19, 2013

(87) PCT Pub. No.: WO2011/097498
PCT Pub. Date: Aug. 11, 2011

(65) Prior Publication Data
US 2013/0239614 A1    Sep. 19, 2013

Related U.S. Application Data

(60) Provisional application No. 61/301,352, filed on Feb. 4, 2010.

(51) Int. Cl.
| A44C 17/00 | (2006.01) |
| A44C 27/00 | (2006.01) |
| C23C 14/22 | (2006.01) |
| C23C 14/08 | (2006.01) |
| C23C 14/34 | (2006.01) |

(52) U.S. Cl.
CPC .......... *A44C 17/00* (2013.01); *Y10T 428/24942* (2015.01); *Y10T 428/261* (2015.01); *Y10T 428/265* (2015.01); *C23C 14/221* (2013.01); *C23C 14/081* (2013.01); *C23C 14/3442* (2013.01); *A44C 27/007* (2013.01)

(58) Field of Classification Search
None
See application file for complete search history.

(56) References Cited

U.S. PATENT DOCUMENTS

| 3,539,379 | A | * | 11/1970 | Mayer | 427/255.19 |
| 5,573,684 | A | * | 11/1996 | Winston et al. | 219/121.85 |
| 6,025,060 | A | * | 2/2000 | Meissner | 428/220 |
| 2005/0274144 | A1 | | 12/2005 | Goughnour | |
| 2007/0157667 | A1 | * | 7/2007 | Maltezos et al. | 63/32 |
| 2008/0282733 | A1 | | 11/2008 | Tolwani | |
| 2009/0246370 | A1 | * | 10/2009 | Gupta et al. | 427/248.1 |
| 2010/0068503 | A1 | * | 3/2010 | Neogi et al. | 428/323 |

FOREIGN PATENT DOCUMENTS

GB          1491361 A  * 11/1977

OTHER PUBLICATIONS

O'Donoghue, GEMS, 2006, pp. 524-526 and 782-791.*

* cited by examiner

*Primary Examiner* — David Sample
(74) *Attorney, Agent, or Firm* — Boyle Friedrickson, S.C.

(57) ABSTRACT

The present invention provides a diamond simulant with greater similarity to a diamond than cubic zirconia. The present invention further provides a diamond simulant with durability, hardness, and optical features closer to that of a genuine diamond that previously afforded by other diamond simulants, such as cubic zirconia.

20 Claims, 1 Drawing Sheet

SAPPHIRE COATED GEMSTONE

CROSS-REFERENCE TO RELATED APPLICATION

The present invention claims the benefit of U.S. Ser. No. 61/301,352, filed Feb. 4, 2010, the disclosure of which is incorporate herein in its entirety.

FIELD OF THE INVENTION

The present invention relates generally to gemstone simulants and, more particularly, a sapphire coated diamond simulant.

BACKGROUND OF THE INVENTION

Diamonds have historically been the most popular of all gemstones, and are frequently used in wedding bands, engagement rings, pendants, earrings, and other types of jewelry. Because of their popularity and additional market forces, diamonds are generally more expensive than other gemstones. As a result, diamond simulants that simulate the optical properties of diamonds but at a fraction of the cost are becoming increasingly popular. Additionally, with the growing awareness of conflict diamonds, there is increased consumer apprehension regarding the origin of diamonds and thus increased consumer reluctance to purchase authentic diamonds. As such, there has been a growing demand for synthetic diamonds and diamond simulants, such as cubic zirconia and moissanite.

Cubic zirconia is a cubic crystalline form of zirconium dioxide that is hard, can be optically flawless, and is often colorless. Because of its durability, generally low cost to produce, and visual likeness to diamond, cubic zirconia is commonly used as a diamond simulant. Despite having a visual appearance close to that of diamond, there are notable characteristics distinguishing cubic zirconia from diamond.

For example, diamond has a hardness of 10.0 on the Mohs hardness scale whereas cubic zirconia has a hardness of 8.0. A diamond has a light refractive index 2.417 whereas cubic zirconia has a light refractive index of approximately 2.2. A diamond has a dispersion value of 0.044 nm whereas cubic zirconia has a dispersion value of approximately 0.06 nm. Cubic zirconia weighs approximately 1.7 times more than diamond of an equivalent size. A diamond may also have a yellow tint. Any color present in a cubic zirconia gemstone is typically the result of an additive.

Thus, while there are significant similarities between cubic zirconia and diamond that make cubic zirconia a popular diamond simulant, there are significant differences between cubic zirconia and diamond that make consumers reluctant to purchase a cubic zirconia instead of a diamond. For example, cubic zirconia is brittle compared to a diamond, and thus is less durable and prone to scratching. Also, colorless cubic zirconia will give off a rainbow-like reflection that is not found in genuine diamonds.

SUMMARY OF THE INVENTION

The present invention provides a diamond simulant with greater similarity to a diamond than cubic zirconia. The present invention further provides a diamond simulant with durability, hardness, and optical features closer to that of a genuine diamond that previously afforded by other diamond simulants, such as cubic zirconia.

According to one aspect of the invention, a gemstone simulant has a body formed from a composition containing yttrium and zirconia. A sapphire coating is applied to an exterior surface of the body.

In accordance with another aspect of the invention, a method of forming a diamond simulant is provided. The method includes forming a gemstone from a composition consisting essentially of yttrium and zirconia, and applying a coating of $Al_2O_3$ to the gemstone.

In accordance with another aspect of the invention, a diamond simulant consists essentially of yttrium, zirconia, hafnium, gadolinium, and aluminum oxide.

According to a further aspect of the invention, a gemstone consists essentially of a diamond simulant and a sapphire coating applied to the diamond simulant.

It is therefore an object of the present invention to have a gemstone simulant having physical and visual characteristics similar to that of a diamond.

It is another object of the invention to improve the diamond simulant characteristics of a known diamond simulant, such as zirconia.

It is yet another object of the invention to provide a method for making a gemstone simulant using a coating of sapphire or similar material.

Other objects, features, and advantages of the invention will become apparent to those skilled in the art from the following detailed description and accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

The drawings illustrate the best mode presently contemplated of carrying out the invention.

In the drawings.

DESCRIPTION OF THE INVENTION

Figure 1:
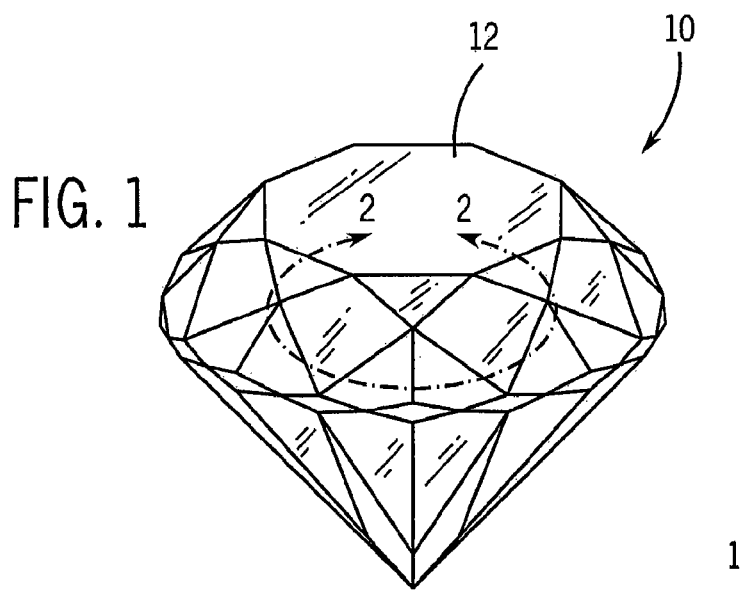
FIG. 1 is an isometric view of a gemstone simulant according to the invention.
Figure 2:
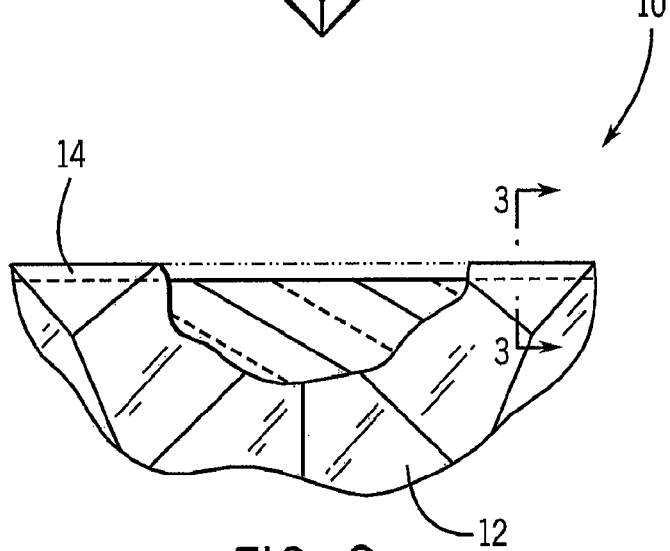
FIG. 2 is a partial cutaway isometric view of the gemstone stimulant of FIG. 1.
Figure 3:
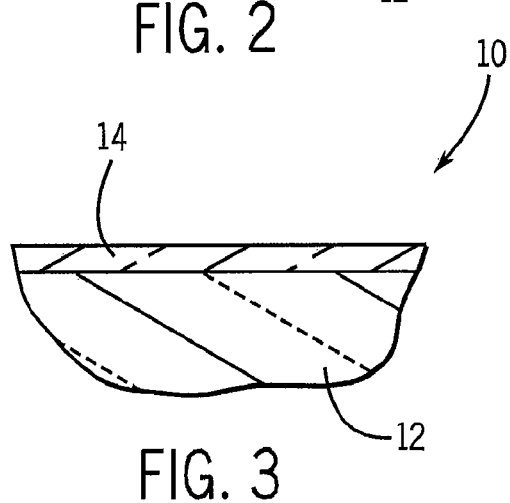
FIG. 3 is a section view of the gemstone simulant taken along line 3-3 of FIG. 1.

Turning now to the figures, the present invention includes a diamond simulant 10 having properties closer to that of diamond than other types of diamond simulants. The diamond simulant 10 is generally comprised of a gemstone body 12 fabricated from a composition consisting essentially of yttrium and zirconia with a sapphire or $Al_2O_3$ coating 14 applied to an exterior surface of the body 12. Sapphire has a hardness and a refraction index closer to that of diamond than cubic zirconia and therefore the diamond simulant of the present invention has a hardness and refraction index closer to that of diamond. As such, when the sapphire coating 14 is applied to the body 12 the resulting simulant 10 is more like a real diamond. That is, the simulant 10 is durable, less prone to scratching, and has a visual appearance similar to that of diamond. The body 12 may also include hafnium and other constituents, such as gadolinium.

In a preferred implementation, the present invention provides a diamond simulant 10 consisting essentially of yttrium, zirconium, hafnium, gadolinium, and other trace elements, as well as a sapphire coating 14. The addition and/or substitution of hafnium and gadolinium to the standard cubic zirconia formula also results in a gemstone with more diamond-like properties.

In a preferred embodiment, the sapphire coating 14 is applied using ion beam assisted deposition (IBAD); however, other types of application techniques may be used. The sapphire coating or chemical equivalent, e.g., $Al_2O_3$, is preferably deposited onto the gemstone in a uniform, conformal, and amorphous manner, and to a thickness of one optical half-wave (1400-1700 Å). The thickness of the coating is sufficient to improve the hardness of the gemstone without negatively impacting its visual appearance. That is, diamond-like carbon, which is commonly used as a coating for diamond simulants, has a definitive black color. As a result, very little diamond-like carbon can be used without affecting the color of the simulant. In contrast, the sapphire or $Al_2O_3$ coating 14 of the present invention is transparent in the visual spectrum. Also, the sapphire coating 14 of the present invention has a lower refractive index than the underlying gemstone and, as such, the sapphire coating does not alter the total internal reflection of the gemstone. Diamond-like carbon, on the other hand, has a refractive index higher than cubic zirconia. In additional contrast to the present invention, diamond-like carbon is applied using chemical vapor deposition.

The present invention may also be embodied in a method of forming a diamond simulant 10. The underlying gemstone body 12 can be manufactured in a conventional manner from a composition containing yttrium, zirconia, hafnium, and gadolinium. The sapphire coating 14 may be applied to a bulk of simulant material or applied to individual simulants after they have been cut from the bulk. Color may also be added in a manner as known in the art.

In an alternate embodiment, the sapphire coating 14 is applied to a conventional diamond simulant, such as cubic zirconium, to provide a simulant having characteristics closer to that of diamond.

It will be appreciated that the diamond simulant of the present invention may be used in various forms of jewelry, including but not limited to rings and bands, pendants, necklaces, charms, brooches, and the like. The diamond simulant may also be cut to have a desired cut and carat using known cutting techniques. In such cases, the coating is applied after cutting.

Many changes and modifications could be made to the invention without departing from the spirit thereof. The scope of these changes will become apparent from the appended claims.

We claim:

1. A method of forming a diamond simulant, comprising:
   forming a gemstone from a composition consisting essentially of yttrium and zirconia; and
   applying a coating of $Al_2O_3$ to the gemstone, wherein the coating is applied using ion-beam assisted deposition.

2. The method of claim 1 wherein forming the gemstone includes adding hafnium to the composition.

3. The method of claim 1 wherein forming the gemstone includes adding gadolinium to the composition.

4. The method of claim 1 wherein the coating is applied to a thickness of 1400-1700 Å.

5. The method of claim 1 further comprising adding color to the coating.

6. The method of claim 1 wherein the coating has a thickness of one optical half-wave.

7. The method of claim 1 wherein the coating is transparent in the visual spectrum.

8. The method of claim 1 wherein the gemstone has a first refractive index and the coating has a second refractive index lower than the first refractive index.

9. A method of forming a diamond simulant, comprising:
   forming a cubic zirconia gemstone; and
   applying a sapphire coating to the cubic zirconia gemstone; wherein the coating is applied using ion-beam assisted deposition.

10. The method of claim 9 wherein forming the cubic zirconia gemstone includes adding yttrium to a composition of the cubic zirconia gemstone.

11. The method of claim 9 wherein forming the cubic zirconia gemstone includes adding hafnium to a composition of the cubic zirconia gemstone.

12. The method of claim 9 wherein forming the cubic zirconia gemstone includes adding gadolinium to a composition of the cubic zirconia gemstone.

13. The method of claim 9 wherein the sapphire coating is applied to a thickness of 1400-1700 Å.

14. The method of claim 9 further comprising adding color to the sapphire coating.

15. The method of claim 9 wherein the sapphire coating has a thickness of one optical half-wave.

16. The method of claim 9 wherein the sapphire coating is transparent in the visual spectrum.

17. The method of claim 9 wherein the cubic zirconia gemstone has a first refractive index and the sapphire coating has a second refractive index lower than the first refractive index.

18. A method of forming a diamond simulant, comprising:
   forming a gemstone from a composition consisting essentially of zirconia; and
   applying a coating of $Al_2O_3$ to the gemstone; wherein the coating is applied using ion-beam assisted deposition.

19. The method of claim 18 wherein forming the gemstone includes adding to the composition one or more additives selected from the group consisting of yttrium, hafnium and gadolinium.

20. The method of claim 18 wherein the coating is applied to a thickness of 1400-1700 Å.

* * * * *